United States Patent [19]

Heiter

[11] 4,232,399

[45] Nov. 4, 1980

[54] CONTINUOUSLY VARIABLE PHASE SHIFT NETWORK

[75] Inventor: George L. Heiter, Andover, Mass.

[73] Assignee: Bell Telephone Laboratories, Incorporated, Murray Hill, N.J.

[21] Appl. No.: 948,889

[22] Filed: Oct. 5, 1978

[51] Int. Cl.³ .......................... H04B 7/08; H03H 11/20
[52] U.S. Cl. .................................. 455/276; 328/155; 333/101; 333/164; 455/304
[58] Field of Search ................. 325/56, 305, 306, 367, 325/369, 371, 476; 328/55, 155, 152–154; 343/854; 333/101, 103, 24.1, 156–164; 455/137–139, 276, 278, 52, 273, 304

[56] References Cited

U.S. PATENT DOCUMENTS

| | | | |
|---|---|---|---|
| 2,786,133 | 3/1957 | Dyke | 325/369 |
| 2,931,981 | 4/1960 | Schabauer | 328/55 |
| 2,951,996 | 9/1960 | Pan | 333/161 |
| 3,356,947 | 12/1967 | Di Toro | 328/55 |
| 3,419,823 | 12/1968 | Seidel | 328/155 |
| 3,571,765 | 3/1971 | Friedman | 333/164 |
| 3,582,790 | 6/1971 | Curtis | 325/369 |
| 3,629,715 | 12/1971 | Brown et al. | 328/155 |
| 3,718,873 | 2/1973 | Garver | 333/164 |

Primary Examiner—Marc E. Bookbinder
Attorney, Agent, or Firm—Sylvan Sherman

[57] ABSTRACT

Continuously variable phase shift is obtained by means of two variable phase shifters (20,21) located in two separate, switchable parallel wavepaths (18, 19). The first phase shifter (20) is variable over, at least, the range between zero and 180 degrees. The second phase shifter (21) is variable over, at least, the range between 180 degrees and 360 degrees. Switching means (22, 23) are provided for switching the signal to one or the other phase shifter. A control circuit (16) simultaneously causing the phase shift through the two phase shifters to vary in the opposite sense. When maximum phase shift is reached, the control circuit switches the signal from one phase shifter to the other, thereby providing continuously variable phase shift through the network.

8 Claims, 6 Drawing Figures

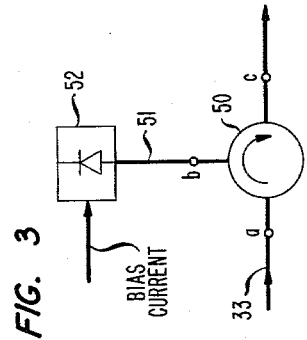
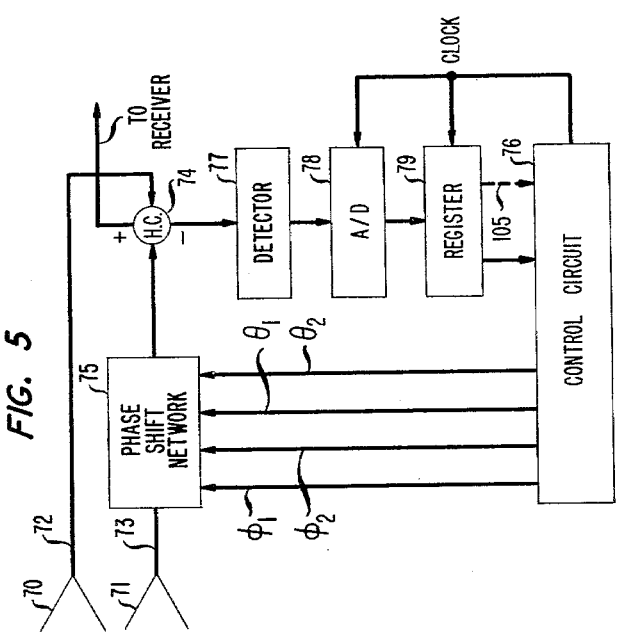

CONTINUOUSLY VARIABLE PHASE SHIFT NETWORK

TECHNICAL FIELD

This invention relates to continuously variable phase shifters and, in particular, to circuit arrangements for combining, in phase, the two received signals in a space diversity receiver.

BACKGROUND OF THE INVENTION

It is well known that radio waves, propagating from a transmitter to a receiver, can follow a plurality of different paths and that the relative phases of the waves arriving at the receiving antenna can be such as to destructively interfere, causing what is commonly referred to as a fade. In order to reduce the opportunity for this to occur, the so-called "space diversity" system has been developed using two, spaced antennas to feed a common receiver. The theory underlying the use of two spaced-apart antennas is that there is less likelihood that a fade will occur at both antennas at the same time. In the simplest system, means are provided for disconnecting the receiver from the first antenna as soon as the received signal falls below a predetermined threshold level, and for connecting the receiver to the second antenna. In this so-called "blind switch" it is assumed that the signal received by the second antenna will be stronger than that received by the first antenna. In a more sophisticated system, the signals from the two antennas are combined at radio frequency instead of merely selecting the larger of the two. This eliminates amplitude and phase jumps associated with the switching operation, and has the added advantage of delivering a larger amplitude signal to the receiver. However, such a system requires the use of dynamic phase correction to compensate for variations in the relative phase of the two signals caused by changes in their path lengths. In one such system, described in U.S. Pat. No. 2,786,133, a single, continuously adjustable phase shifter is included in one of the antenna wavepaths and is automatically adjusted so that the wave from the one antenna has the proper phase to combine with the wave from the other antenna. U.S. Pat. No. 3,582,790 shows, in greater detail, a means for combining the two received signals and for isolating the two antennas from each other. The circuit includes a first phase shifter which shifts the phase of one of the input signals to bring it into quadrature phase relationship with the other. The quadrature related signals are combined in a first hybrid coupler to produce a pair of equal amplitude signals. The phase of one of the two signals is then shifted 90 degrees by a second phase shifter so as to bring the two signals in phase. The two equal, in-phase signals are then combined in a second hybrid coupler to produce a single output signal whose total power is equal to the sum of the powers of the two received signals.

Both of these systems seek to track the two signals continuously and do so by means of continuously variable phase shifters. The problem with such prior art phase shifters is that in order to go from maximum phase shift back to zero, it is necessary to go through all values therebetween. To illustrate the problem, consider two waves whose relative phase difference is slowly increasing. As the phase difference increases, it will eventually reach 360 degrees at which point the two signals are again in phase. However, a phase shifter such as the type illustrated in U.S. Pat. No. 2,786,133 does not ease past its maximum phase shift to zero phase shift but, instead, must be reset by going completely through its entire range of phase shifts from its maximum setting to its minimum setting, causing a sudden fluctuation in the amplitude of the output signal, including the possibility of signal cancellation. What is desired is a phase shifter which is capable of providing increasing or decreasing phase shifts without a return-toward-zero requirement.

The return-toward-zero problem is also present in other types of continuously variable phase shifters. For example, U.S. Pat. No. 3,419,823 shows a phase shifter comprising a tandem array of a 90 degree hybrid coupler and a 3 dB, 180 degree hybrid coupler. In this embodiment, the phase of the output signal is controlled by either changing the power division ratio of the 90 degree coupler, or by changing the attenuation in one of the two wavepaths connecting the two couplers. In either case, the return-toward-zero problem is not resolved by the phase shifter described in this patent.

The return-toward-zero problem can be avoided by using stepping phase shifters of the types disclosed in copending applications Ser. Nos. 578,528 now U.S. Pat. No. 3,993,050 and 878,561, now U.S. Pat. No. 4,153,994, filed concurrently on Feb. 17, 1978, wherein the signal phase can be advanced or retarded continuously in 90 degree steps. However, it is a limitation of this approach that phase correction is made in discrete increments and, hence, is only approximate. For example, the two signals can be as much as 45 degrees out of phase, resulting in some signal loss due to phase error. This can be avoided by using both a phase stepper and a continuously variable phase shifter of limited range in the manner described by K. L. Seastrand, Jr. in his copending application Ser. No. 905,156, now U.S. Pat. No. 4,160,952 filed May 12, 1978, and assigned to applicant's assignee.

One difficulty with all of the above-described phase shifters employing 90 degree phase steppers is that switching transients occur every 90 degrees. Advantageously, a phase shifter for use in a space diversity receiver would be capable of continuously variable phase shift; have no return-toward-zero problem; have fewer switching transients, less loss and increased bandwidth.

SUMMARY OF THE INVENTION

The problems and limitations of prior art phase shifters are obviated in a continuously variable phase shift network comprising two variable phase shifters located in two separate, switchable parallel wavepaths. One of the phase shifters is variable at least over the range between zero degrees and 180 degrees. The other phase shifter is similarly variable at least over the range between 180 degrees and 360 degrees. Switching means are provided for switching between the two wavepaths.

When used in a space diversity receiver, the phase shifters and the switching means are responsive to changes in phase between the two received signals.

It is an advantage of the present invention that switching, and the associated transients occur every 180 degrees instead of every 90 degrees. It is a further advantage of the invention that the maximum transient loss is limited to 6 dB. It is an added advantage that the insertion loss is reduced and the bandwidth is increased when compared, for example, with the above-cited Miedema phase stepper.

BRIEF DESCRIPTION OF THE DRAWINGS

FIGS. 3 and 4 show illustrative embodiments of a phase switch and a phase shifter, respectively;

FIG. 5 shows the invention used in conjunction with a space diversity antenna system; and FIG. 6 shown, in block diagram, an illustrative embodiment of a control circuit for controlling the phase of a phase shift network.

DETAILED DESCRIPTION

Figure 1:
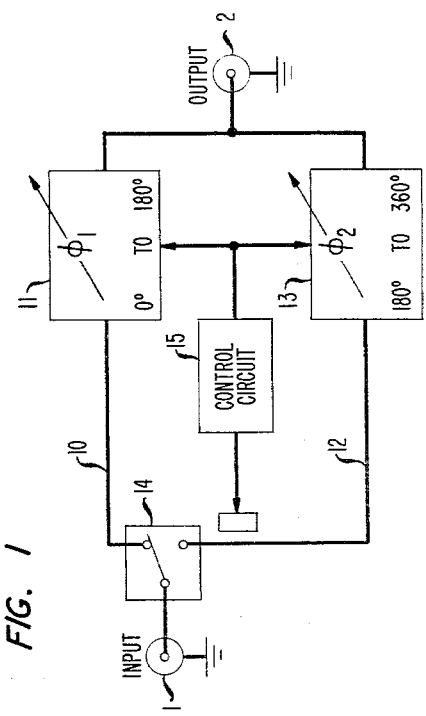
FIG. 1 shows, in block diagram, a first embodiment of a continuously variable phase shift network in accordance with the present invention.

Referring to the drawings, FIG. 1 shows in block diagram a first embodiment of a continuously variable phase shift network in accordance with the present invention. The network comprises a first phase shifter 11 that is continuously variable at least over a range between zero degrees and 180 degrees, and a second phase shifter 13 that is continuously variable at least over a range between 180 degrees and 360 degrees. The phase shift through the respective phase shifters is determined by control circuit 15 in a manner to be described in greater detail hereinbelow.

The phase shifters are located in separate, switchable parallel wavepaths 10 and 12 which are selectively connected between input terminal 1 and output terminal 2 by means of a switch 14. At the lower operating frequencies, the switch can be a simple relay, as illustrated, and only one end of wavepaths 10 and 12 need be switched. The output ends can be permanently connected to output terminal 2. At the higher frequencies, however, it is advantageous to effect switching at both ends of wavepaths 10 and 12. In either case, switching between wavepaths is controlled by control circuit 15.

In operation, the phases of the two phase shifters are caused to vary oppositely to each other such that as one increases in phase the other decreases. For example as the phase shift $\phi_1$ through phase shifter 11 increases in the direction from zero degrees to 180 degrees, the phase shift $\phi_2$ through phase shifter 13 decreases in the direction from 360 to 180 degrees. Thus, if the required phase shift called for by control circuit 15 is increasing from 160 degrees to 210 degrees, $\phi_1$ will be increasing towards 180 degrees as $\phi_2$ is simultaneously decreasing towards 180 degrees. Both will reach 180 degrees at the same time, thereby making for a smooth transition from wavepath 10 to wavepath 12 when switch 14 switches between wavepaths. Similarly, a smooth transition occurs at 360 degrees since phase shifter 13 reaches 360 degrees as phase shifter 11 reaches zero degrees. Thus, as noted hereinabove, switching only occurs when a phase change at 180 degrees or 360 degrees is required. In addition, there is no return-towards-zero problem in that the transition from 360 degrees to zero degrees is continuous, and does not require the phase shifter to rotate in the opposite sense through all values between 360 degrees and zero degrees in order to reach zero.

Figure 2:
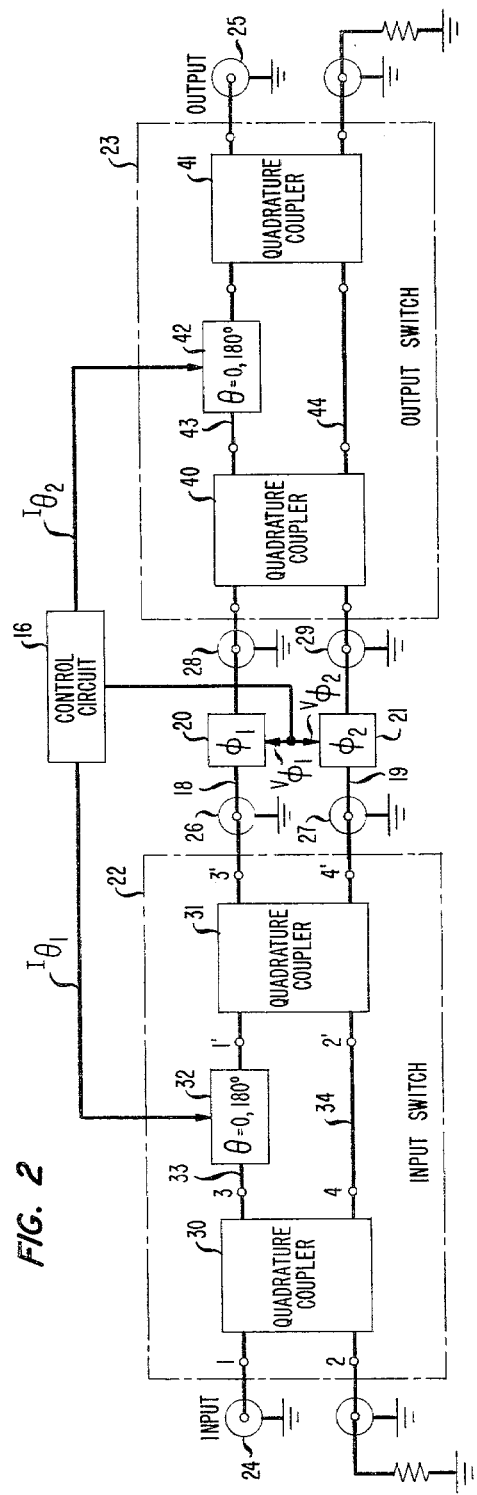
FIG. 2 shows an alternate embodiment of the invention.

FIG. 2, now to be considered, shows an alternate embodiment of the invention particularly adapted for operation at the higher frequencies where impedance matching is of particular importance. In this embodiment, the two phase shifters 20 and 21, located, respectively in wavepaths 18 and 19, are switched at both ends by a pair of switches 22 and 23, each of which comprises a pair of 3 dB quadrature couplers and a phase switch for introducing either zero or 180 degrees of relative phase shift in one of the two wavepaths connecting the two couplers. In particular, input switch 22 comprises a first 3 dB quadrature coupler 30 having two pairs of conjugate ports 1-2 and 3-4; a second 3 dB quadrature coupler 31 having two pair of conjugate ports 1'-2' and 3'-4'; and a pair of wavepaths 33 and 34 for connecting one pair of conjugate ports 3-4 of coupler 30 to one pair of conjugate ports 1'-2' of coupler 31. In order to switch input port 24 between either of the two switch output ports 26 and 27, a phase switch 32 is included in one of the wavepaths 33 connecting the two couplers.

Similarly, output switch 23 comprises a pair of 3 dB quadrature couplers 40 and 41 interconnected by means of a pair of wavepaths 43 and 44, one of which 43 includes a phase switch 42.

In operation, a signal applied to port 24 will be coupled to switch output port 27 when zero differential phase shift is introduced by phase switch 32. After traversing phase shifter 21, the signal is coupled from port 29 of switch 23 to output port 25 when zero differential phase is introduced by phase switch 42.

To switch the signal from phase shifter 21 to phase shifter 20, the phase shift introduced by differential phase switches 32 and 42 is changed from zero to 180 degrees by control circuit 16. In all other respects, the operation of the phase shift network is as explained in connection with the embodiment of FIG. 1.

FIG. 3 shows an illustrative embodiment of a 0–180 degree phase switch, of the type that can be used in the input and output switches 22 and 23 of FIG. 2. The switch comprises a circulator 50, a length of transmission line 51; and a PIN diode 52. Referring more specifically to phase switch 32, circulator 50 is disposed in wavepath 33 such that the circulator input port a is connected to port 3 of coupler 30; intermediate circulator port b is connected to one end of line 51 whose other end is terminated by diode 52; and output circulator port c is connected to port 1' of coupler 31.

In operation, a signal applied to circulator port a leaves the circulator at port b, traverses the length of line 51, and is reflected back to the circulator by the diode. The reflected signal reenters the circulator at port b and exits from port c. The total phase shift through this circuit depends upon the length of transmission line 51 and the state of conduction of diode 52. In particular, the total phase shift differs by 180 degrees, depending upon whether the diode is in a low conduction state, i.e., appears as an open circuit, or a high conduction state, i.e., appears as a short circuit. Thus, by controlling the conduction state of the diode by means of an externally applied bias current, a differential phase shift of 180 degrees is obtained.

FIG. 4 shows an illustrative embodiment of a continuously variable phase shifter. Basically, the continuously variable phase shifter is the same as the phase switch of FIG. 3, comprising a circulator 60, a length of line 61 and a diode 62. However, for the continuously variable phase shifter, a varactor diode is employed as the adjustable component. Thus, the phase shift obtained is varied by means of a variable bias voltage applied to the diode. In those cases where the desired phase shift range is not conveniently obtainable in a single stage, two or more phase shifters of the type shown in FIG. 4 can be connected in cascade.

In some applications, such as space diversity combiners, it may be advantageous to introduce a small amount of phase overlap, or hysteresis into the two phase shifters. In particular, by making the overlap greater than the phase jitter in the system, spurious switching at the extremes of $\phi_1$ and $\phi_2$ can be avoided. Thus, for example, in a system having a phase jitter of ±2 degrees, the range of $\phi_1$ can be extended by 5 degrees, i.e., from zero to 185 degrees, and that of $\phi_2$ extended from 180 to 365 degrees.

As indicated hereinabove, one important application of a continuously variable phase shifter of the type described herein is in the antenna circuit of a space diversity receiver. FIG. 5, now to be considered, shows in block diagram a space diversity system comprising a pair of spaced antennas 70,71 coupled to a receiver by means of wavepaths 72 and 73 and a signal combiner 74. One of the wavepaths 73 is shown to include a phase shift network 75, of the type described herein, under the control of a control circuit 76. The latter obtains a control signal from the difference port of signal combiner 74 by way of an amplitude detector 77, an analog-to-digital (A/D) converter 78, and a register 79.

While the specifics of the control circuit logic will vary, depending upon the mode of operation selected, the general nature of how phase shift network 75 can be made to function in a space diversity system will become readily apparent. For purposes of illustration and explanation it is assumed in the description that follows that the phase shift introduced by network 75 is continuously varying in small regular increments, and that the only thing that is changed in response to the difference signal derived from combiner 74 is the sense of this phase shit change. Thus, if no control signal is applied to the control circuit 76, the latter will cause the two phase shifters (i.e., 20 and 21 of FIG. 2) to sweep through their full range in small incremental steps. That is, while $\phi_1$ is increasing from zero to 180 degrees in steps of 5 degrees, for example, $\phi_2$ is similarly decreasing from 360 to 180 degrees. When both reach 180 degrees, the control circuit will switch phase shifter 20 out of the network and switch phase shifter 21 into the network. In addition, the control network will cause the two phase shifters to reverse their sense of rotation, causing $\phi_1$ to decrease from 180 degrees back to zero, and $\phi_2$ to increase from 180 degrees to 360 degrees. When the former reaches zero degrees and the latter reaches 360 degrees, the control circuit will switch back to phase shifter 20, and cause the two shifters again to reverse their sense of rotation. Thus, in the absence of an input signal to control circuit 76, the total phase shift through the network will continuously increase in small incremental steps.

A phase control signal serves to modify this behavior in a manner to minimize the difference signal derived from signal combiner 74, which signal is a measure of the phase difference between the two received signals applied to the signal combiner from paths 72 and 73. This is done by detecting the amplitude of the difference signal, converting the detected signal to a digital signal, and storing this information in register 79. This sampling of the difference signal is under the control of a clock signal derived from control circuit 76. Each sample, in addition, is compared with the previous sample. If the most recent sample is less than the last stored sample, it means that the phase shift being introduced into antenna circuit 73 by network 75 is bringing the two received signals into phase coincidence and, hence, no change in the sense of the phase changes is required. If, on the other hand, the most recent sample is greater than the last stored sample, it means that the sense of rotation of the phase shift is wrong, and a sense reversal is required. This is effectuated by the control circuit, and such sense changes will continue so as to cause the difference signal to decrease. Once the correct phase shift is reached, the system will hunt back and forth about the correct phase shift. However, it should be noted that the "correct" phase shift in a diversity system is a dynamic value which tends to change as a function of time.

FIG. 6 shows in block diagram an illustrative embodiment of control circuit 76 for controlling phase shift network 75. Basically, the control circuit includes a main up/down counter 90 and, in those cases where a phase overlap is provided, a pair of hysteresis counters 91 and 92. The output from the main counter is coupled through a first D/A converter 94 to the plus input terminal of a first driver amplifier 96 whose output $V_{\phi 1}$, provides the bias signal to one of the two phase shifters (i.e., 20 in FIG. 2). The main counter output is similarly coupled through D/A converter 94 to the minus input terminal of a second driver amplifier 97 whose output $V_{\phi 2}$ provides the bias signal to the other phase shifter (i.e., 21 in FIG. 2).

In operation, the main counter, through its D/A converter, supplies a triangular waveform (i.e., ramp) to the opposite polarity input terminals of the driver amplifiers. This causes the phases of the two phase shifters to change in opposite directions. When the main counter reaches its limit, its sense of counting is reversed by a signal from a controller 101. In addition, the controller activates the appropriate hysteresis counter which provides an override signal, thus extending the voltage ramps applied to the corresponding phase shifters. When the limit of the hysteresis counter is reached, the controller activates a switch latch circuit 98 which provides switching current $I_{\theta 1}$ and $I_{\theta 2}$ to the two switches (i.e., 22 and 23 in FIG. 2) through a pair of driver amplifiers 99 and 100. Thus, in the absence of any sense of rotation signal applied to the controller, the phase shift network introduces a continuously varying phase shift in a given sense in the antenna wavepath.

If, however, the controller receives a signal from register 79 (FIG. 5) calling for a change in the sense of phase rotation, the sequence described above is reversed. That is, if the count in the main counter was increasing, it will start to decrease, and will continue to do so until it reaches a limit, or is once again reversed by the controller in response to a signal from register 79 calling for a change in the sense of phase rotation.

In the description given above, it was stated that the phase shift network will hunt back and forth about the correct phase shift. With a slight increase in circuit complexity, now to be described, this hunting can be avoided.

When the two signals coupled into signal combiner 74 from wavepaths 72 and 73 are in phase, the difference signal, coupled by detector 77 to register 79, is very small. In accordance with an alternate embodiment of a control circuit, register 79 generates a disabling signal whenever the difference signal falls below a prescribed level. The disabling signal is coupled to the main counter 90, and serves to stop the phase rotation described hereinabove. In this manner, the correct phase shift is maintained and the hunting about the correct value is avoided. In FIGS. 5 and 6, optimal wavepath 105, shown as a dashed line between register 79 and counter 90 in control circuit 76, connects the disabling signal in the manner described.

As the relative phase of the two received signals changes, the difference signal will tend to increase. When this increase exceeds the prescribed level, the disabling signal to the main counter is removed, and the operation described hereinabove is resumed.

I claim:

1. A continuously variable phase shift network having input and output ports for use in a space diversity antenna system having two antennas, each for receiving an incoming signal characterized in that said network comprises:
   a first wavepath (18) including a first phase shifter (20) for producing a continuously variable phase shift between zero and at least 180 degrees;
   a second wavepath (19) including a second phase shifter (21) for producing a continuously variable phase shift between 180 and at least 360 degrees;
   an input switch (22) and an output switch (23) for connecting one or the other of said wavepaths between the input and output ports (24,25) of said network;
   and a control circuit (16) for controlling the phase shift through said network in response to a signal that is a function of the phase difference between the two signals received by said space diversity antenna system (70, 71, 72, 73, 74, 75).

2. The network according to claim 1 characterized in that said control circuit (16) causes the phase shift through said network to vary continuously; and in that the sense of said phase variation changes in response to the phase difference function signal received from said antenna system.

3. The network according to claim 1 characterized in that said control circuit is disabled when said phase shift network reduces the phase difference between said two signals to less than a given amount.

4. The network according to claim 1 characterized in that said control circuit causes the phase shift through said network to vary in incremental steps.

5. A variable phase shift network having an input port (1) and an output port (2) including:
   a first wavepath (10) including first phase shifting means (11) capable of producing a phase shift that is continuously variable between at least 0 and 180 degrees;
   a second wavepath (12) including second phase shifting means (13) capable of producing a phase shift that is continuously variable at least between 180 and 360 degrees;
   characterized by:
   switching means (14) for connecting one or the other of said wavepaths (10 or 12) between the input port (1) and the output port (2) of said network;
   and a control circuit (15) for causing the phase shifts simultaneously produced by said phase shifting means (11, 13) to vary oppositely to each other, and for activating said switching means.

6. The phase shift network according to claim 5 wherein said control circuit (15) causes said phase shifting means (11, 13) to change in incremental steps.

7. The phase shift network according to claim 5 wherein said control circuit (15) causes said phase shifting means (11, 13) to vary continuously over their respective ranges.

8. The phase shift network according to claim 5 wherein said control circuit (15) switches from said first to said second wavepaths (10, 12) when said first phase shifting means (11) reaches the limit of its phase shift range, and switches from said second to said first wavepath when said second phase shifting means (13) reaches the limit of its phase shift range.

* * * * *